(12) United States Patent
Lymn et al.

(10) Patent No.: US 6,440,215 B1
(45) Date of Patent: Aug. 27, 2002

(54) FLUID KNIFE

(75) Inventors: Peter Philip Andrew Lymn, Petersfield; Richard Andrew Wilson, Chichester, both of (GB)

(73) Assignee: Circuit Engineering Marketing Company Limited, Hamphsire (GB)

( * ) Notice: Subject to any disclaimer, the term of this patent is extended or adjusted under 35 U.S.C. 154(b) by 9 days.

(21) Appl. No.: 09/583,624

(22) Filed: May 31, 2000

(30) Foreign Application Priority Data

Jun. 2, 1999 (GB) .............................................. 9912773

(51) Int. Cl.[7] .............................................. B05C 11/06
(52) U.S. Cl. .......................... 118/62; 118/63; 228/20.1; 239/594; 239/597
(58) Field of Search ........................... 118/62, 63, 300; 427/348; 228/20.1; 239/594, 597

(56) References Cited

U.S. PATENT DOCUMENTS

| | | | | |
|---|---|---|---|---|
| 3,667,425 A | * | 6/1972 | Bozeman et al. .............. | 118/63 |
| 3,741,643 A | * | 6/1973 | Smith et al. .................. | 118/63 |
| 3,917,888 A | * | 11/1975 | Beam et al. .................. | 118/63 |
| 5,565,040 A | * | 10/1996 | Donlan, Jr. et al. ........... | 134/26 |

* cited by examiner

*Primary Examiner*—Laura Edwards
(74) *Attorney, Agent, or Firm*—Ware, Fressola, Van Der Sluys & Adolphson LLP

(57) ABSTRACT

Air knives 109,110 for a solder leveller each comprises an air knife tip 111. The tip has a nozzle slot 114, up-and down-stream lands 119, 115, which are parallel to a back surface 130. Beyond the lands, the tip has a wing 120 and a lip 117, with a wing face 121 and a lip face 118 Downstream from the lip face 118, an extension 131 is provided. This is set back 132 sufficiently far from the land 115 to have no fluid dynamic effect on a board being processed. The geometry of the wing and tip faces 121, 118 is such that the bulk of air from the slit passes over the wing and back towards solder applicators, carrying with it excess solder. The tips 111, that is an upper and a lower one for upper and lower air knives are mounted on plenum chambers 133 via their back datum surfaces 130. The plenum chambers are mounted in the solder leveller with the back surfaces 130 parallel to the board path.

14 Claims, 2 Drawing Sheets

FLUID KNIFE

TECHNICAL FIELD

The present invention relates to a so-called fluid knife, that is to say a device having one or more nozzles for producing a jet of fluid which is wide and thin. The fluid knife is for use in the treatment of boards, particularly though not exclusively printed circuit boards.

BACKGROUND OF THE INVENTION

Fluid knives find particular application in a solder leveller, that is to say a machine through which printed circuit boards are passed for application and leveling of molten solder, the leveling being carried out by causing the fluid jet to impinge on the board and smooth the solder to a uniform thickness. Both liquid and gas can be passed through the nozzle(s) of a fluid knife to form the jet(s). Fluid knives have other applications in circuit board treatment, for instance in treating, washing and drying them. They also have application in other fields.

In a solder leveller, control of the thickness of the leveled solder is of importance. For this, control of the position of the board with respect to the air knives—as they usually are—is important. Nevertheless there are a limited number of parameters which can be adjusted to control the position of the board.

In a conventional air knife, although the jets are directed against the direction of travel of the board through the air knife, a substantial quantity of the air leaves the air knife in the downstream direction of travel of the board. With the air comes a substantial quantity of oil and solder droplets. Not only is this undesirable in terms of lost materials and contamination of other equipment; but also the biggest problem is that it can lead to contamination of the tinned boards by unwanted solder deposition.

SUMMARY OF THE INVENTION

We have surprisingly found that with an asymmetric air knife apparently having a freer air passage downstream, we can direct more oil and solder upstream of the board travel than with a symmetric air knife The object of the present invention is to utilise this effect to provide an improved fluid knife.

According to one aspect of the invention there is provided a fluid knife for producing a jet of fluid which is wide and thin for use in the treatment of a board, the fluid knife comprising:
 a body having a nozzle side with a nozzle surface,
 one or more nozzles in the nozzle side of the body for producing the wide, thin jet of fluid,
  the nozzle(s) defining by their orientation a mean, jet plane and
  the nozzle(s) intersecting the nozzle surface of the body at orifice(s),
  the mean jet plane dividing the nozzle surface of the body into:
   a wing face and a lip face,
   the wing face having a dimension transverse to the jet plane which is greater than the lip face dimension transverse to the jet plane and
   the wing face sloping shallowly and the lip face sloping steeply when the body is arranged with the jet plane substantially vertical,
 the arrangement being such that in use with a board closely spaced from the orifice(s), the board is drawn towards the fluid knife and the bulk of the fluid passes over the wing and not the lip.

Whilst either of the wing face and the lip face may have non-planar features, they will normally be planar. In this case, the bisector plane of the two planar faces—in its extent through the body—is on the wing face side of the jet plane.

In use, in the absence of a board, the fluid jet leaves the nozzle(s) in the jet plane. With a board closely spaced from the orifice(s), the fluid exiting from the nozzles is directed to either side of the plane. We have noted two surprising effects:

1. The air passing between the wing and the board establishes a partial vacuum, or at least a local pressure depression, such that the board is drawn towards the fluid knife despite the jet being directed against the board; and
 2. The bulk of the fluid passes over the wing and not the lip despite the lip being narrower.

These effects can be utilised in a solder leveling fluid knife to:
 i. Control the separation of the board from the orifices; and
 ii. Direct the bulk of the leveling fluid back upstream of the board travel and with it the oil and solder droplets.

Preferably, the fluid knife includes a datum surface defining knife inclination in use with respect to a board path in a board treatment machine, the jet plane being angled to make an acute angle with respect to the board path on the lip face side of the jet plane.

Again, the fluid knife preferably includes a narrow land on either or both of the wing and the lip adjacent the nozzle(s), the narrow land(s) preferably being parallel a board path in use of the fluid knife in a board treatment machine.

Various configurations are possible. In a first, the body of the fluid knife comprises two tips, the tips being attached together and providing respectively the lip and the wing, and the nozzle comprises a single slot between the tips.

Alternatively, the body of the fluid knife comprises a solid block, and the nozzle comprises a series of closely spaced bores extending in the solid block from its nozzle surface to a back surface.

In another alternative:
 the body of the fluid knife comprises a single block;
 the nozzle comprises a single slot extending only part way through the block from the nozzle surface, and
 a plurality of bores are provided in a back surface of the block to communicate with the slot.

The plurality of bores can be arranged in the jet plane defined by the slot; or the plurality of bores can be arranged in two planes angled to either side of the jet plane defined by the slot.

BRIEF DESCRIPTION OF THE DRAWINGS

To help understanding of the invention, a specific embodiment thereof will now be described with reference to the accompanying drawings, in which.

BEST MODE FOR CARRYING OUT THE INVENTION

Figure 1:
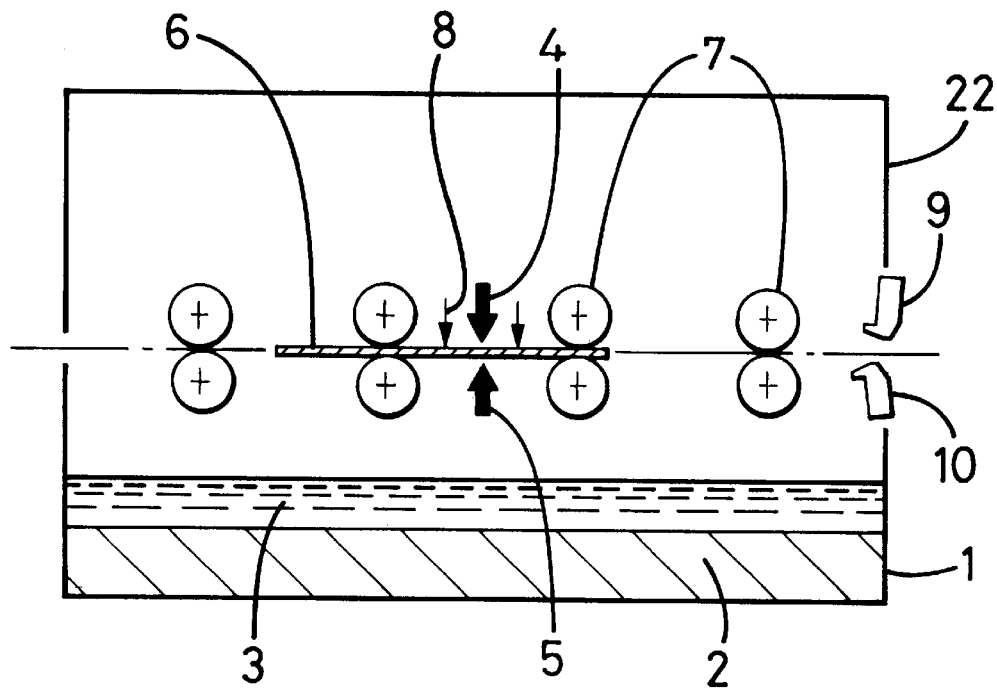
FIG. 1 is a diagrammatic side view of a solder leveller with an air knife of the invention.

The solder leveller of FIG. 1 has a solder sump 1 containing molten solder 2 covered with anti-oxidant oil 3. Solder applicators 4,5 apply solder from above and below onto a board 6 being passed through the leveller by feed rollers 7. Oil 3 is applied onto the board from oil applicators 8 with the solder from above. Both the oil and the solder are fed to the applicators by non-shown pumps. Downstream of the applicators, a solder leveling pair of air knives 9,10 is provided. Both the air knifes 9,10 are in accordance with the invention.

Each air knife includes a pair of tips 11,12. They are bolted together to define a plenum 13, to which hot air at a fraction of a bar above atmospheric pressure is pumped from at least one end. They also define a nozzle slit 14, which runs their length, laterally of the leveller and from which exits an air jet J centred on the mid plane P of the slit, at least in the absence of a board between the air knives. The downstream one 11 of the tips is conventional, having a narrow land 15 extending downstream from the nozzle orifice 16, substantially at right angles to the jet plane P. The land is formed on a lip 17 downstream of the slit. The downstream edge 18 of the lip adjacent the land 15 is heavily chamfered to obviate aerodynamic effects with the board 6. The upstream one 12 of the tips also has a land 19 on a wing 20 extending upstream from the nozzle orifice 16. The land 19 is co-planar with the land 15. The wing has a face 21. It should be noted that collectively the lip and wing faces 18,21 and the lands 15,19 are referred to as the nozzle surface of the air knife.

The face 21 of the wing forms an acute angle $\alpha$ with the plane P and an angle $\beta$ with the board path through the leveller. The jet plane P forms an angle $\gamma$ with a normal to the board path. Usually $\gamma$ is the angle off true vertical of the planes P. The narrow lands 15,19 lie at the same angle $\gamma$ to the board path. The lip face 18 forms an angle $\delta$ with the jet plane P. It should be noted that the magnitude of the angles $\alpha$ & $\delta$ is such that the bisector plane B of the two faces 18, 21 lies on the wing side of the plane P as it passes through the tips.

The lower air knife is set closer to the applicators than the upper air knife by a conventional spacing S. The air knives are set at a mean height H with respect to the path N of the board 6 defined by the nip of the rollers 7, such that the board is biased towards the lower air knife. Once the leading edge of the board has passed over the lower air knife, the effect of the air flow of its jet J being deflected up- and down-stream beneath the board from the slit 14 in the lower air knife is to generate a reduced pressure beneath the board between it and the wing, on account of the gap G between them diverging in the upstream direction. This effect is greater than the effect of the board being blown away from the air knife by the direct action of the jet J on the board. Consequently, the board is attracted towards the lower air knife. Since too close approach of the board to the air knife would limit the amount of air exiting from the nozzle orifice 16, the position of the board is stable. We have noted that the bulk of the air flow is towards the wing side as opposed to the lip side, which we understand to result from reduced pressure over the wing, with the corollary that little air is exits on the lip side. Consequently, the bulk of the oil and solder removed from the board by the air knife is deflected upstream and back into the sump 1 or is at least contained within a cowl 22 over the sump, from which the air is withdrawn by a non-shown pump.

The upper air knife being positioned downstream of the lower one has its tips spaced further from the board. So whilst the reduced pressure effect establishes and with it the flow of the bulk of the air, oil and solder back towards the sump, the pressure reduction is less. Thus the board remains biased towards the lower air knife. However, it is in a stable position, whereby the gap between the board and the tips of the upper air knife is also stable and predictable. The actual position can be regulated by for instance regulating the flow of air from the respective air knives, the inclination $\gamma$ of the plane P to the board path N, the width of the wings, the angle $\alpha$ of the top face of the wings to the plane P and other parameters.

It may be appropriate to provide means for biasing the board to one or other of the air knives before it reaches them, e.g. with a supplementary jet arranged just upstream of the air knives.

Figure 2:
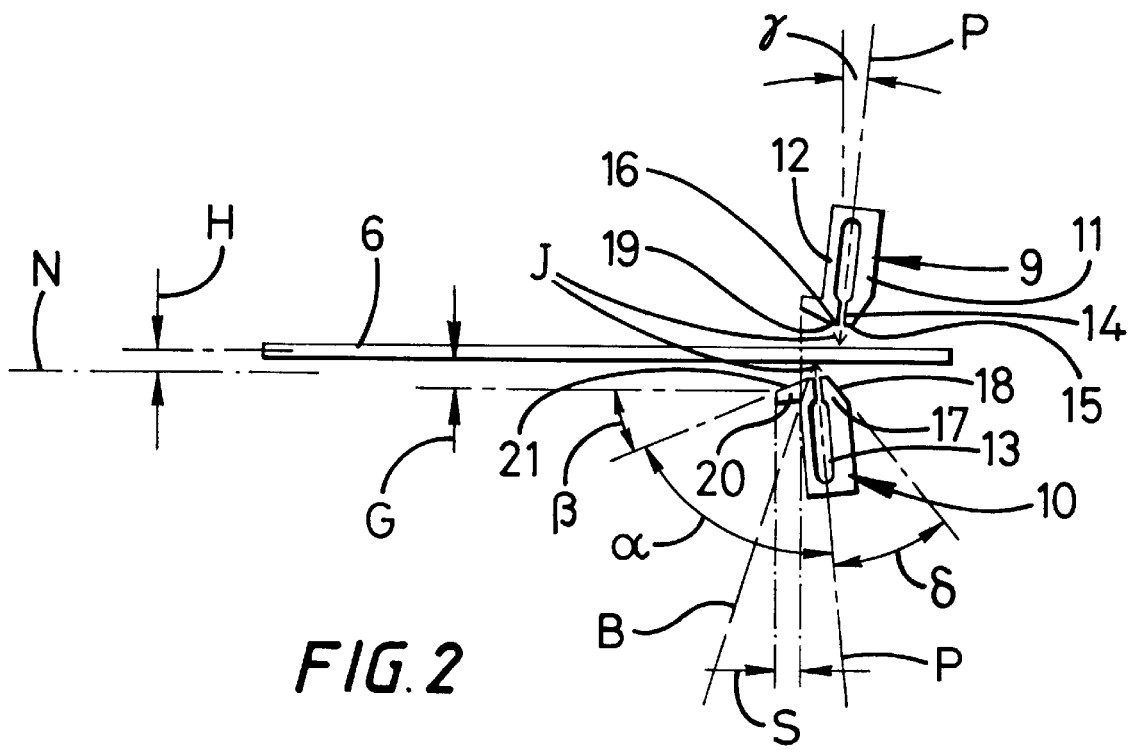
FIG. 2 is a more detailed cross-sectional side view of the air knifes with a printed circuit board therebetween, with the air knives shown spaced further than their scale spacing from the board for the sake of clarity.

In the preferred embodiment, the angle $\alpha$ is 78°; the lands 15,19 are typically 1 mm wide whilst the wing face 21 is 13 mm wide, i.e. an order of magnitude wider. In the solder leveller, the plane P is inclined—$\gamma$—by 5° towards the applicators. Tests have shown that with these dimensions, a typical separation of the board from the tips of the lower air knife is 0.1 mm (this dimension being exaggerated in FIG. 2). The angle $\beta$ can be varied from 6° to 22°. Preferably it is in the region of 10° to 16°. The angle $\delta$ is typically of the order of 35° or more in order to avoid the reduced pressure effect over the lip 17 which is present over the wing 20. Thus the lip face 18 is angled at the order of 50° to the board path.

Variations are possible in the details of the above described embodiment. For instance the narrow land 15,19 may be arranged to be parallel to the board path, that is to say at respective angles to the plane P of 85° & 95°, with the plane P inclined by 5° towards the applicators, that is 5° off true vertical. It may not be necessary to give the panel a particular bias to one or other air knife, because of the effect of gravity and the aerodynamic effect of the first air knife which the board reaches first is likely to predominate.

Figure 3:
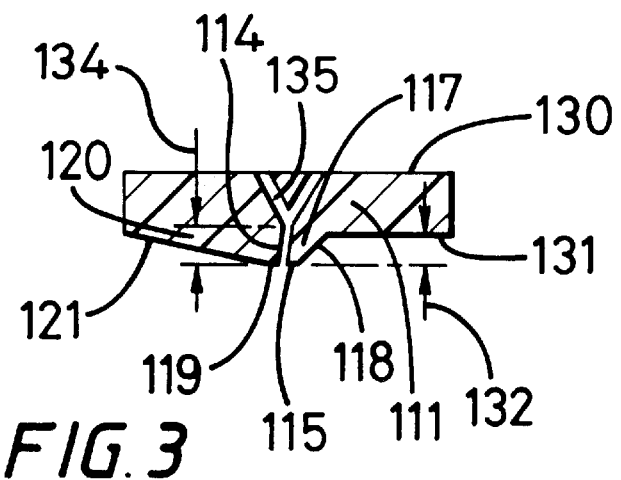
FIG. 3 is a transverse cross-sectional view of an alternative air knife tip.
Figure 4:
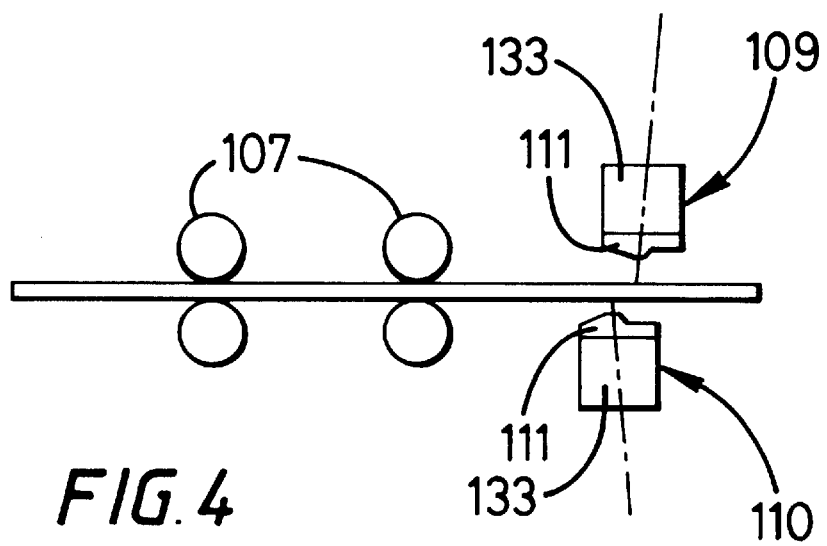
FIG. 4 is a view similar to FIG. 2 of the alternative air knife tips in use in a board dryer, again shown with exaggerated spacing of the air knife tips from the board.
Figure 5:
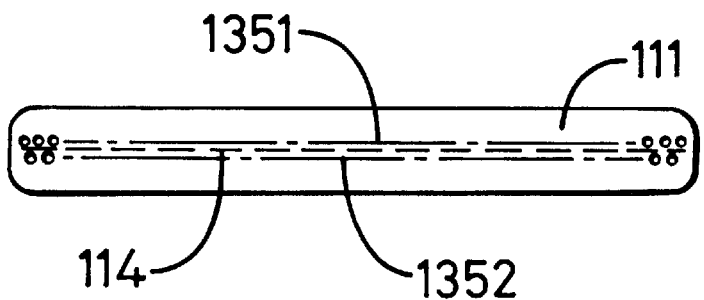
FIG. 5 is a back view of the air knife tip of FIG. 3.

Turning now to FIGS. 3, 4 & 5, the air knives 109,110 there shown can be installed in a board drying machine—whose other details are conventional and will not be separately described, except that drive rollers are shown diagrammatically in FIG. 4. Each air knife comprises an air knife tip 111, of plastics material—suitably polypropylene. Such material is useful in not scuffing boards being processed. However, a tip construction as in the first embodiment is not practical with this material, which is insufficiently rigid. Further, the material is insufficiently rigid to have a nozzle slot cut right through it, hence the configuration described in the next paragraph. The tip has a nozzle slot 114, up- and down-stream lands 119,115, which are parallel to a back surface 130. Beyond the lands, the tip has a wing 120 and a lip 117, with a wing face 121 and a lip face 118. Downstream from the lip face 118, an extension 131 is provided. This is set back 132 sufficiently far from the land 115 to have no fluid dynamic effect on a board being processed. The geometry of the wing and tip faces 121,118 and the slit 114 is generally similar to that of the equivalent features in the tips 11,12 and will not be repeated. The tips 111, that is an upper and a lower one for upper and lower air knives are mounted on plenum chambers 133 via their back datum surfaces 130. The plenum chambers are mounted in the solder leveller with the back surfaces 130 parallel to the board path.

To avoid the slit 114 dividing the tip into two (except an its ends), with attendant difficulties in regulating the width of the slit, it extends only part way 134 through the body of the tip. A series of drillings 135 from the back surface 130 to the slit provide air flow passages from the plenum chamber to the slit. As shown, the drillings are set in two mutually angle banks 1351,1352. However a single line of drillings or even three angled banks are possible.

The invention is not intended to be restricted to the details of the above described embodiments. For instance the air knife tip of FIG. 3 can be incorporated in a solder leveller, although for such use, high temperature plastics or metal is required since polypropylene has too low a melting point for heated air to be passed through it. Further the air knives can be used in machines other than levellers and dryers, such as chemical reagent machines. Further it is anticipated that the knives will find used with other fluids, such as washing liquid and chemical reagents.

What is claimed is:

1. A board processing machine including a fluid knife for producing a jet of fluid which is wide and thin for use in the treatment of a board, the machine including at least one pair of rollers for feeding the board to a fluid knife pair including upper and lower fluid knives above and below a board path defined by the rollers, each fluid knife comprising:

a body having a nozzle side with a nozzle surface, and at least one nozzle in the nozzle side of the body for producing the wide, thin jet of fluid, each nozzle defining by its orientation a mean, jet plane and each nozzle intersecting the nozzle surface of the body at a corresponding orifice, the mean jet plane dividing the nozzle surface of the body into a wing face and a lip face, the wing face having a dimension transverse to the jet plane which is greater than the lip face dimension transverse to the jet plane and the wing face sloping shallowly and the lip face sloping steeply when the body is arranged with the jet plane substantially vertical, the board processing machine being such that:

in use a board passing along the board path is closely spaced from the at least one orifice, the board is drawn towards the fluid knife and the bulk of the fluid passes over the wing and not the lip, and the two fluid knives are relatively staggered along the board path.

2. A board processing machine according to claim 1, wherein the wing face and the lip face are planar and the bisector plane of the two planar faces—in its extent through the body—is on the wing face side of the jet plane.

3. A board processing machine according to claim 1, wherein the jet plane is angled to make an acute angle with respect to the board path on the lip face side of the jet plane.

4. A board processing machine according to claim 1, including a datum surface defining knife inclination in use with respect to a board path in a board treatment machine, the wing face being angled at between 6° and 22° to the board path.

5. A board processing machine according to claim 4, wherein the wing face is angled at between 10° and 16° to the board path.

6. A board processing machine according to claim 3, wherein the lip face is angled at the order of 50° to the board path.

7. A board processing machine according to claim 1, including a narrow land on either or both of the wing and the lip adjacent the at least one nozzle.

8. A board processing machine according to claim 7, wherein each narrow land is parallel a board path in use of the fluid knife in a board treatment machine.

9. A board processing machine according to claim 7, wherein the wing face is substantially greater in width than each land.

10. A board processing machine according to claim 1, wherein:

the body comprises two tips, the tips being attached together and providing respectively the lip and the wing, and the nozzle comprises a single slot between the tips.

11. A board processing machine according to claim 1, wherein:

the body comprises a solid block, and the nozzle comprises a series of closely spaced bores extending in the solid block from its nozzle surface to a back surface.

12. A board processing machine according to claim 1, wherein:

the body comprises a solid block;

the nozzle comprises a single slot extending only part way through the block from the nozzle surface; and a plurality of bores are provided in a back surface of the block to communicate with the slot.

13. A board processing machine according to claim 12, wherein the plurality of bores are arranged in the jet plane defined by the slot.

14. A board processing machine according to claim 12, wherein the plurality of bores are arranged in two planes angled to either side of the jet plane defined by the slot.

\* \* \* \* \*